United States Patent [19]

Vaartstra

[11] Patent Number: 5,763,633
[45] Date of Patent: Jun. 9, 1998

[54] METAL CARBOXYLATE COMPLEXES FOR FORMATION OF METAL-CONTAINING FILMS ON SEMICONDUCTOR DEVICES

[75] Inventor: Brian A. Vaartstra, Nampa, Id.

[73] Assignee: Micron Technology, Inc., Boise, Id.

[21] Appl. No.: 764,840

[22] Filed: Dec. 3, 1996

Related U.S. Application Data

[62] Division of Ser. No. 654,562, May 29, 1996, Pat. No. 5,695,815.

[51] Int. Cl.$^6$ ............................................. C07F 15/00
[52] U.S. Cl. ............................................. 556/136
[58] Field of Search ............................................. 556/136

[56] References Cited

U.S. PATENT DOCUMENTS 5,401,535  3/1995  Bishop ................................ 427/229

OTHER PUBLICATIONS

Cullen et al., Canadian Journal of Chemistry, vol. 72, No. 5, pp. 1294–1301, May 1994.
28 pages of structures of known Ru, Rh, Pd, Os, Ir, and Pt compounds. (1996).
Bondurant et al., "Ferroelectrics for nonvolatile RAMs," *IEEE Spectrum*, 30–33 (Jul. 1989).
Bradley et al., "Novel Precursors for the Growth of III–V Semiconductors by Movpe," *Journal of Crystal Growth*, 75, 101–106 (1986).
Haszeldine et al., "Organic Reactions Involving Transition Metals. Part IV. Carboxylatodiene Complexes of Rhodium(I) and Iridium(I)," *J. Chem. Soc.*, (A), 3696–3698 (1971).
Haworth et al., "Soaps of Some Transition Metal Complexes," *Synth. React. Inorg. Met.–Org. Chem.*, 19(8), 871–880 (1989).
Hoke et al., "Low–temperature Vapour Deposition of High–purity Iridium Coatings from Cyclooctadiene Complexes of Iridium," *J. Mater. Chem.*, 1(4), 551–554 (1991).
Yuan et al., "Low–Temperature Chemical Vapor Deposition of Ruthenium Dioxide from Ruthenium Tetroxide: A Simple Approach to High–Purity $RuO_2$ Films," *Chem. Mater.*, 5, 908–910 (1993).

*Primary Examiner*—Porfirio Nazario-Gonzalez
*Attorney, Agent, or Firm*—Mueting, Raasch & Gebhardt, P.A.

[57] ABSTRACT

A method of forming a metal-containing film on a substrate, such as a semiconductor wafer. The method involves depositing a Group VIII metal carboxylate complex on the substrate, wherein the Group VIII metal is selected from the group consisting of Ru, Os, Rh, Ir, Pd, and Pt, and thermally decomposing the Group VIII metal carboxylate complex to form the metal-containing film.

8 Claims, 2 Drawing Sheets

METAL CARBOXYLATE COMPLEXES FOR FORMATION OF METAL-CONTAINING FILMS ON SEMICONDUCTOR DEVICES

This is a division of application Ser. No. 08/654,562, filed May 29, 1996, now U.S. Pat. No. 5,695,815.

FIELD OF THE INVENTION

This invention relates to the preparation of semiconductor devices, particularly to methods of depositing metal-containing films, particularly metal oxide films, using metal carboxylate complexes, and to the metal carboxylate complexes themselves.

BACKGROUND OF THE INVENTION

Films of metals and metal oxides, particularly the heavier elements of Group VIII metals and oxides thereof, are becoming important for a variety of electronic and electrochemical applications. For example, high quality $RuO_2$ thin films deposited on silicon wafers have recently gained interest for use in ferroelectric memories. Many of the Group VIII metal films are unreactive to silicon and metal oxides, resistant to diffusion of oxygen and silicon, and are good conductors. Oxides of certain of these metals also possess these properties, although perhaps to a different extent.

Thus, films of Group VIII metals and metal oxides, particularly the second and third row metals (e.g., Ru, Os, Rh, Ir, Pd, and Pt) have suitable properties for a variety of uses in integrated circuits. For example, they can be used in integrated circuits for electrical contacts. They are particularly suitable for use as barrier layers between the dielectric material and the silicon substrate in memory devices, such as ferroelectric memories. Furthermore, they may even be suitable as the plate (i.e., electrode) itself in the capacitors.

Capacitors are the basic energy storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs). It is important for device integrity that oxygen and/or silicon not diffuse into or out of the dielectric material. This is particularly true for ferroelectric RAMs because the stoichiometry and purity of the ferroelectric material greatly affect charge storage and fatigue properties.

Thus, there is a continuing need for methods and materials for the deposition of metal-containing films, such as metal oxide films, in integrated circuits, particularly in random access memory devices.

SUMMARY OF THE INVENTION

The present invention is directed to a method of manufacturing a semiconductor device, particularly a ferroelectric device. The method involves forming a metal-containing film using a Group VIII metal carboxylate complex. The metal-containing film can be a metal film, a metal oxide film, a metal sulfide film, a metal selenide film, a metal nitride film, or the like. Typically and preferably, the metal-containing film is electrically conductive. The resultant film can be used as a barrier layer in an integrated circuit structure, particularly in a memory device such as a ferroelectric memory device.

This method involves the steps of: depositing a Group VIII metal carboxylate complex on the substrate using a nonvolatile deposition technique, wherein the Group VIII metal is selected from the group consisting of Ru, Os, Rh, Ir, Pd, and Pt; and thermally decomposing the Group VIII metal carboxylate complex to form the metal-containing film. This method is particularly well suited for forming such films on a surface of a silicon substrate, such as a silicon wafer used in forming integrated circuits. The films can be formed on a blanket wafer or on a patterned wafer. That is, the films can be formed directly on the wafer (e.g., silicon wafer, gallium arsenide wafer, etc.), or they can be formed on any of a variety of the layers (i.e., surfaces) in a patterned wafer. Preferably, the nonvolatile deposition technique comprises spin-on coating, dip coating, or spraying.

A preferred method of the present invention involves thermally decomposing a metal carboxylate complex of the formula:

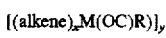

wherein: alkene refers to a neutral hydrocarbon ligand having one or more carbon—carbon double bonds (preferably a neutral linear or monocyclic hydrocarbon ligand); M is a second or third row Group VIII metal in the +1 oxidation state; R is a $(C_3-C_{20})$hydrocarbon group (preferably a $(C_3-C_{20})$alkyl group); x=0–4y; and y=1–5.

The present invention also provides Group VIII metal carboxylate complexes, wherein the metal is selected from the group consisting of Ru, Os, Rh, Ir, Pd, and Pt. Specifically, the present invention provides a metal carboxylate complex of the formula:

wherein: alkene refers to a neutral hydrocarbon ligand having one or more carbon—carbon double bonds (preferably a neutral linear or monocyclic hydrocarbon ligand); M is a second or third row Group VIII metal in the +1 oxidation state; R is a $(C_3-C_{20})$alkyl moiety (preferably a $(C_3-C_{12})$alkyl moiety, and more preferably a $(C_3-C_8)$alkyl moiety); x=0–4y (preferably, x=0–2y); and y=1–5 (preferably, y=1–3). Preferably, the alkene refers to a neutral linear or monocyclic hydrocarbon ligand.

DETAILED DESCRIPTION

Figure 1:
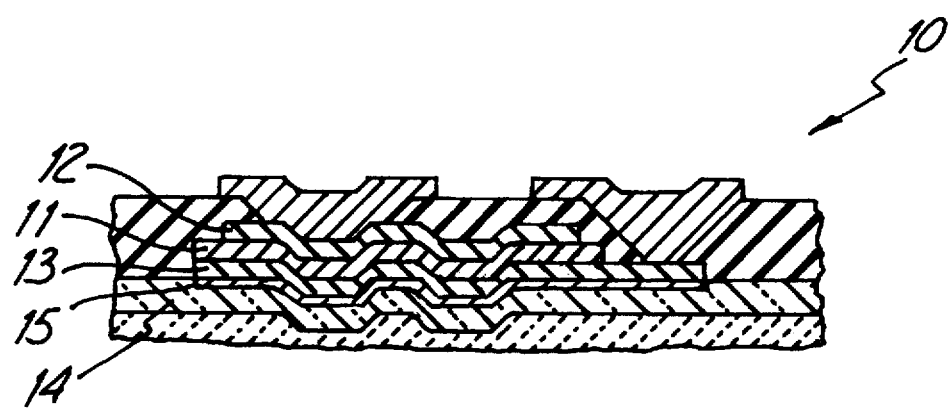
FIG. 1 is a cross-sectional schematic of a thin layer ferroelectric memory device having a conductive metal-containing layer between the bottom electrode and underlying silicon-containing layers.

The present invention provides a method of forming a metal-containing film, preferably an electrically conductive metal-containing film (e.g., metal, metal oxide, metal sulfide, metal selenide, metal nitride, etc.), using a Group VIII metal carboxylate complex, and to the Group VIII metal carboxylate complexes themselves, wherein the Group VIII metal (i.e., the iron triad of metals) is selected from the group consisting of Ru, Os, Rh, Ir, Pd, and Pt. Such complexes are suitable for use in nonvolatile deposition or film-casting techniques such as spraying, spin-on, and dip coating.

Specifically, the present invention is directed to a method of manufacturing a semiconductor device, particularly a ferroelectric device, having a metal-containing film. The metal-containing films formed are conductive and can be used as barrier layers between the dielectric material and the silicon substrate in memory devices, such as ferroelectric memories, or as the plate (i.e., electrode) itself in the capacitors, for example. Because they are generally unreactive, such films are also suitable for use in optics applications as a reflective coating or as a high temperature oxidation barrier on carbon composites, for example. They can be deposited in a wide variety of thicknesses, depending on the desired use.

The designation "carboxylate complex" refers to a metal complex containing negatively charged carboxylate ligands formed from a carboxylic acid or substituted carboxylic acid. Any of a variety of carboxylate ligands can be present in the metal carboxylate complex as long as the complex can be used to form a metal-containing film using standard nonvolatile film-casting techniques such as spraying, spin-on, and dip coating. The carboxylate ligand stabilizes the metal complex and can be tailored in the length of its hydrocarbon chain to yield desired solubility and viscosity characteristics. Examples of suitable carboxylate ligands include, but are not limited to, 2-ethylhexanoate, octanoate, decanoate, dodecanoate, and cis-9-tetradecenoate.

The carboxylate complex can also include other neutral ligands that are easily dissociated. This includes, for example, alkenes containing one carbon—carbon double bond (i.e., mono-alkenes), both linear and cyclic, such as ethylene, propylene, and cyclooctene, dienes (i.e., alkenes containing two carbon—carbon double bonds), both linear and cyclic, such as butadiene, cyclooctadiene, cyclopentadiene, and polyenes (i.e., alkenes containing three or more carbon—carbon double bonds) such as benzene, toluene, and xylene. Included within the scope of these unsaturated ligands that are easily dissociated are bicyclic ligands, although linear or monocyclic ligands are generally preferred.

These complexes are particularly advantageous for the deposition of metal films, metal oxide films, or other metal-containing films, using film-casting techniques such as spin-on technology or MOD (i.e., metalorganic deposition) technology because they do not vaporize from the surface before thermal decomposition to form the metal-containing film. This is due to the relatively high intermolecular forces and high molecular weight of the carboxylate ligands. Thus, the complexes of the present invention are typically not suitable for chemical vapor deposition.

Preferably, the metal carboxylate complexes have the following general formula:

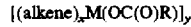

wherein: alkene refers to a neutral hydrocarbon ligand having one or more carbon—carbon double bonds (which includes dienes and polyenes); M is a second or third row Group VIII metal in the +1 oxidation state; R is a $(C_3-C_{20})$ hydrocarbon group (which includes aliphatic groups, aromatic groups, and mixtures thereof); X=0–4y (preferably, X=0–2y); and y=1–5 (preferably, y=1–3). Thus, these complexes can be monomers, dimers, trimers, tetramers, and pentamers.

Of the neutral alkene hydrocarbon ligands, linear or monocyclic ligands having one or more carbon—carbon double bonds are preferred. More preferably, the alkene has 1–4 carbon—carbon double bonds, and most preferably two carbon—carbon double bonds.

In metal complexes such as this, substitution is not only tolerated, but is often advisable. Thus, substitution is anticipated in the compounds of the present invention. As a means of simplifying the discussion and recitation of certain terminology used throughout this application, the terms "group" and "moiety" are used to differentiate between chemical species that allow for substitution or that may be substituted and those that do not so allow or may not be so substituted. Thus, when the term "group" is used to describe a chemical substituent, the described chemical material includes the unsubstituted group and that group with non-peroxidic O, N, or S atoms, for example, in the chain as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

Thus, of the R groups in the carboxylate complexes of the above formula, $(C_3-C_{20})$alkyl groups are preferred, and $(C_3-C_{20})$alkyl moieties are more preferred. Of the alkyl moieties, $(C_3-C_2)$alkyl moieties are preferred, and $(C_3-C_8)$ alkyl moieties are more preferred.

The carboxylate complexes of the present invention can be prepared by a variety of methods. Preferably, they are prepared by the reaction of the complex of the formula (alkene)MX, where X is a halide, with an ammonium (including alkylammonium, dialkylammonium, or trialkylammonium) salt of a carboxylic acid. This method is advantageous because it eliminates the use of alkali metals that are a source of contamination in integrated circuits.

A preferred example of a metal carboxylate complex is the complex Ir(I)(cyclooctadiene)(2-ethylhexanoate) which is suitable for application of an iridium-containing film. This complex can be synthesized by the reaction of (chloro) (cyclooctadienyl)iridium(I) with triethylammonium 2-ethylhexanoate, which is formed from 2-ethylhexanoic acid and triethylamine. Ir(I)(cyclooctadiene)(2-ethylhexanoate) is a red viscous liquid, stable in the presence of air or moisture, and soluble in nonpolar organic solvents, which are all advantageous physical properties for deposition of iridium using nonvolatile deposition methods, such as spin-on coating. Furthermore, this complex forms a dense, substantially crack-free iridium-containing film upon thermal decomposition.

As stated above, the use of the carboxylate complexes and methods of forming conductive metal-containing films of the present invention are beneficial for a wide variety of thin film applications in integrated circuit structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of where a film formed from the complexes of the present invention would be useful is the ferroelectric memory cell 10 of FIG. 1. The memory cell 10 includes a ferroelectric material 11, such as a lead zirconate titanate (PZT) or lithium niobate film, between two electrodes 12 and 13, which are typically made of platinum, although other metals such as gold and aluminum can also be used. The bottom electrode 13 is typically in contact with a silicon-containing layer 14, such as an n-type or p-type silicon substrate, silicon dioxide, glass, etc. The conductive metal-containing layer 15 prepared from a metal carboxylate complex of the present invention is positioned between the bottom electrode 13 and the silicon-containing layer 14 to act as a barrier to diffusion of atoms such as silicon atoms into the electrode and ferroelectric material.

The method of the present invention can be used to deposit a metal-containing film on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate. The metal-containing film is deposited upon thermal decomposition of a metal carboxylate complex that is either liquid at the temperature of deposition or soluble in a suitable solvent that is not detrimental the substrate, other layers thereon, etc. Preferably, however, solvents are not used; rather, the metal carboxylate complexes are liquid and used neat. The method of the present invention utilizes nonvolatile deposition techniques, such as spin-coating, dipping, spraying, etc.

Figure 2:
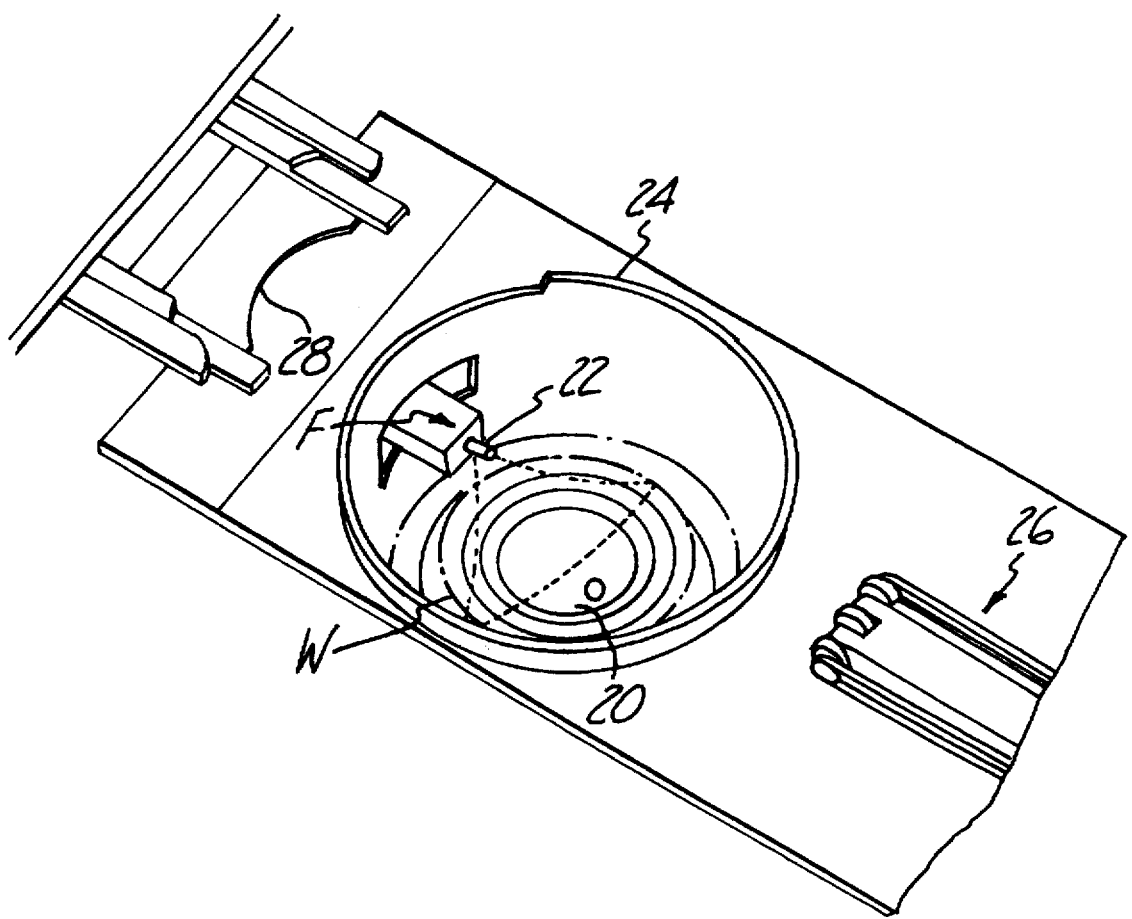
FIG. 2 is a perspective view of a spin-coating apparatus suitable for use in the method of the present invention.

The method is particularly well suited for use with spin-coating systems, as shown in FIG. 2. A spin-coating apparatus includes: a spin chuck 20 for holding a wafer W horizontally in a rotatable manner; a nozzle 22 for supplying the metal carboxylate complex Q described above in liquid form to the upper surface of the wafer W, which is maintained horizontally; means for moving the nozzle 22 over the wafer W in a direction shown by arrow F while the nozzle 22 is supplying the liquid metal carboxylate complex Q; and a cup 24 surrounding the wafer W, for preventing scattering of splashes of the liquid metal carboxylate complex. This apparatus is disposed between a wafer conveying unit 26 for conveying the wafer to an apparatus for a posterior processing and a wafer transferring unit 28 for transferring the wafer W to the spin chuck 20.

During processing, the spin chuck 20 is raised by a lifting unit so that the top portion of the chuck is at the same level as a plane at which the wafer W is transported. The wafer transferring unit 28 then moves a wafer W onto the spin chuck 20. The spin chuck 20 holds the wafer W by a mechanical device or a vacuum contact mechanism. The spin chuck 20 is lowered to a prescribed position while holding the wafer W. When the spin chuck 20 lowers the wafer W to a prescribed level, it rotates the wafer W horizontally (i.e., about a vertical axis over the wafer W in the direction of the arrow F) while dispersing the metal carboxylate complex liquid Q onto the upper surface of the wafer W. The liquid Q is dispersed downward in a fanwise manner to cover the whole surface of the wafer W.

After a layer of the metal carboxylate complex is formed on the wafer W, the spin chuck 20 raises the wafer W to the level defined by the wafer conveying unit 26 and the wafer carrying unit 26. The wafer transferring unit 28 receives the wafer W from the spin chuck 20 and places the wafer W onto the unit 26. The wafer W is then transferred for subsequent processing. Typically, this involves thermally decomposing the metal carboxylate complex to form a metal-containing film.

Although a specific spin-coating process is described by reference to FIG. 2, the method of the present invention is not limited to being used with the specific spin-coating apparatus shown. Furthermore, the method of the present invention is not limited to spin coating. Rather, other non-volatile deposition techniques can be used to deposit the metal carboxylate complexes described herein.

The following examples are offered to further illustrate the various specific and preferred embodiments and techniques. It should be understood, however, that many variations and modifications may be made while remaining within the scope of the present invention.

EXAMPLES

Example 1

Preparation of Ir(I)(cyclooctadiene)(2-ethylhexanoate)

The complex Ir(I)(cyclooctadiene)(2-ethylhexanoate), having the emperical formula $IrO_2C_{16}H_{27}$, was synthesized and demonstrated excellent physical properties for the spin-on deposition of iridium.

This complex was synthesized by partially dissolving 0.40 g (0.0012 mol) of (chloro)(cyclooctadienyl)iridium(I) (Strem Chemical Co.) in 10 mL of acetone. To this was added triethylammonium 2-ethylhexanoate prepared by combining 1.7 mL (0.0107 mol) of 2-ethylhexanoic acid (obtained from High Purity Chemical Inc., Meridian, Id.) and 0.28 mL (0.002 mol) of triethylamine (Aldrich Chemical Co, Milwaukee, Wis.) in acetone. Upon addition of the triethylammonium 2-ethylhexanoate, the mixture was observed to change from orange-red color of the (chloro)(cyclooctadienyl)iridium(I) to a dark red.

The product was separated from the ammonium salt by addition of degassed deionized water to the bulk reaction mixture, and extracting the complex into hexanes. The hexane layer was further washed with two equal portions of deionized water, and the hexanes removed in vacuo. The product is a red viscous liquid, stable in the presence of air or moisture, and soluble in nonpolar organic solvents. Analysis (Schwarzkopf Microanalytical Lab, Woodside, N.Y.): Calc'd for $IrO_2C_{16}H_{27}$: C, 59.69%; H, 9.68%. Found: C, 58.99%; H, 9.75%. Microanalysis further determined that nitrogen due to ammonium salt was below 0.10%.

Example 2

Preparation of an $IrO_2$ Film

The mixture of Ir(I)(cyclooctadiene)(2-ethylhexanoate) and excess 2ethylhexanoic acid (7.25 equivalents of acid per equivalent of iridium complex) prepared in Example 1 was used as is for the deposition. This mixture was spun onto 6 inch silicon wafers at 1000–3000 rpm. After a rapid thermal oxidation at 500° C., $IrO_2$ films varying in thickness of 600–1200 Å thick (determined by profilometry) were obtained, although any one film was substantially uniform in thickness. The sheet resistance of the films were 40–60 ohms/sq as determined by a four-point method on a Prometrix OmniMap RS50/e.

The foregoing detailed description and examples have been given for clarity of understanding only. No unnecessary limitations are to be understood therefrom. The invention is not limited tot he exact details shown and described, for variations obvious to one skilled in the art will be included within the invention defined by the claims.

What is claimed is:

1. A metal carboxylate complex of the formula:

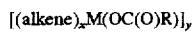

wherein
  (a) alkene refers to a neutral linear or monocyclic hydrocarbon ligand having one or more carbon-carbon double bonds;
  (b) M is a second or third row Group VII metal in the +1 oxidation state;
  (c) R is a $(C_3-C_{20})$alkyl moiety;
  (d) $x=0-4y$; and
  (e) $y=1-5$.

2. The complex of claim 1 wherein the alkene has 1–4 carbon-carbon double bonds.

3. The complex of claim 2 wherein the alkene has two carbon-carbon double bonds.

4. The complex of claim 1 wherein R is a $(C_3-C_{12})$alkyl moiety.

5. The complex of claim 4 wherein R is a $(C_3-C_8)$alkyl moiety.

6. The complex of claim 1 wherein $x=0-2y$.

7. The complex of claim 1 wherein $y=1-3$.

8. The complex of claim 1 which is Ir(I)(cyclooctadiene)(2-ethylhexanoate).

* * * * *

UNITED STATES PATENT AND TRADEMARK OFFICE
CERTIFICATE OF CORRECTION

PATENT NO.: 5,763,633
DATED: June 9, 1998
INVENTOR: Brian A. Vaartstra

It is certified that error appears in the above-identified patent and that said Letters Patent is hereby corrected as shown below:

Column 2, line 20, delete "[(alkene)$_x$M(OC)R)]$_y$" and insert --[(alkene)$_x$M(OC(O)R)]$_y$--;

Column 6, line 51, delete "2ethylhexanoic acid" and insert --2-ethylhexanoic acid--; and Column 6, line 65, delete "tot he" and insert --to the--.

Signed and Sealed this

Seventh Day of December, 1999

Attest:

Q. TODD DICKINSON

*Attesting Officer*  *Acting Commissioner of Patents and Trademarks*

UNITED STATES PATENT AND TRADEMARK OFFICE
CERTIFICATE OF CORRECTION

PATENT NO. : 5,763,633
DATED : June 9, 1998
INVENTOR(S) : Brian A. Vaartstra

It is certified that error appears in the above-identified patent and that said Letters Patent is hereby corrected as shown below:

Column 1,
Line 7, insert:

-- GOVERNMENT RIGHTS
　　This invention was made with United States Government support under Contract No. MDA972-94-C-0006 awarded by the Advanced Research Projects Agency (ARPA). The United States Government has certain rights in this invention. --

Signed and Sealed this

Fourth Day of December, 2001

*Attest:*

NICHOLAS P. GODICI
*Attesting Officer*　Acting Director of the United States Patent and Trademark Office